United States Patent [19]

Wang

[11] Patent Number: 5,397,936
[45] Date of Patent: Mar. 14, 1995

[54] INPUT VOLTAGE-INDUCED SPURIOUS CURRENT CANCELER FOR AUTOZERO TYPE COMPARATOR IN ANALOG-TO-DIGITAL CONVERTERS

[75] Inventor: Yunn-Hwa Wang, Taipei, Taiwan, Prov. of China

[73] Assignee: Industrial Technology Research Institute, Hsinchu, Taiwan, Prov. of China

[21] Appl. No.: 55,748

[22] Filed: May 3, 1993

[51] Int. Cl.6 .................................... H03K 5/153
[52] U.S. Cl. .................................. 327/97; 327/91; 327/94; 327/63; 327/307
[58] Field of Search ............. 307/352, 353, 354, 355, 307/549, 585, 362, 358

[56] References Cited

U.S. PATENT DOCUMENTS

| | | | |
|---|---|---|---|
| 3,676,702 | 7/1972 | McGrogan, Jr. | 307/585 |
| 4,211,942 | 7/1980 | Aoki et al. | 307/355 |
| 4,560,890 | 12/1985 | Masuda et al. | 307/355 |
| 4,656,429 | 4/1987 | Masuda et al. | 307/355 |
| 4,695,748 | 9/1987 | Kumamoto | 307/355 |
| 4,816,701 | 3/1989 | Ando et al. | 307/355 |
| 4,845,383 | 7/1989 | Iida | 307/353 |
| 4,947,168 | 8/1990 | Myers | 341/120 |
| 5,010,338 | 4/1991 | Miki et al. | 307/355 |
| 5,075,688 | 12/1991 | Hosotani et al. | 307/353 |

*Primary Examiner*—Timothy P. Callahan
*Assistant Examiner*—T. Lam
*Attorney, Agent, or Firm*—H. C. Lin

[57] ABSTRACT

In an autozero type MOSFET comparator, the spurious current induced by the high frequency input voltage can flow through the resistance of the reset switch to introduce an offset voltage error during the autozero mode. A canceler is used to prevent the spurious current from flowing through the reset switch. A T-network with two series capacitors and a shunt switch is used as the canceler. The spurious current is by-passed by the shunt switch and prevented from flowing through the reset switch placed at the output of the T-network.

The spurious current canceler is particularly useful for a sub-ranging ADC, where the comparator is used also as a sample-and-hold circuit to hold the input voltage across the series capacitors by opening all the sampling switches, the reset switch and the shunt switch.

10 Claims, 3 Drawing Sheets

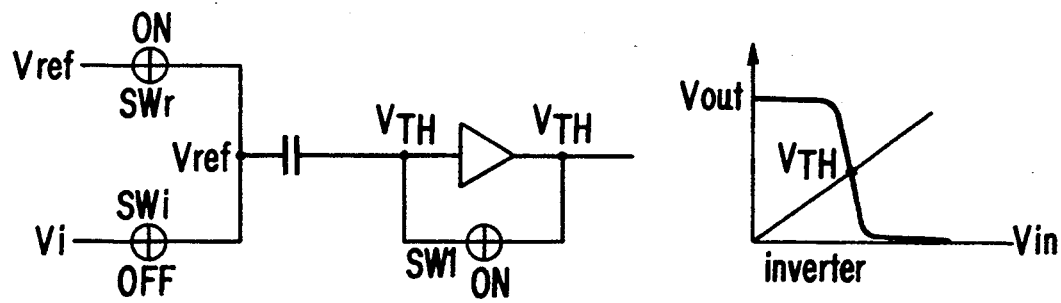
Fig.1a
PRIOR ART
Fig.1b
PRIOR ART
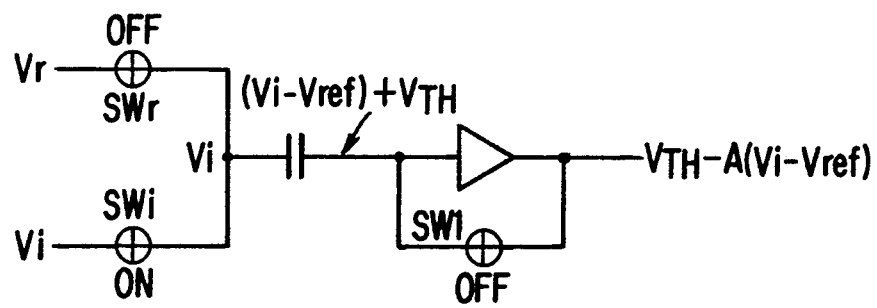
Fig.2
PRIOR ART
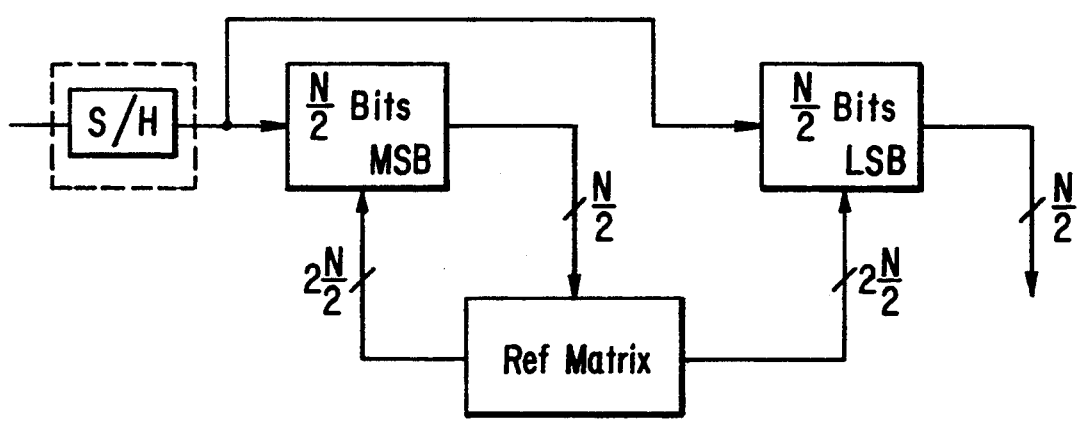
Fig.3
PRIOR ART

INPUT VOLTAGE-INDUCED SPURIOUS CURRENT CANCELER FOR AUTOZERO TYPE COMPARATOR IN ANALOG-TO-DIGITAL CONVERTERS

BACKGROUND

The input offset voltages of complementary metal-oxide-semiconductor transistors (CMOS) have larger offset voltages than bipolar transistors for use in the input differential amplifier of comparators for analog-to-digital converters (ADC). For this reason, autozero-type inverters are often used as comparators in MOS ADC for correcting the undesirable large offset voltage.

The CMOS autozero-type inverter has a basic circuit as shown in FIG. 1(a). There are three switches SWr, SWi and SW1. SWr is connected to a reference voltage Vref; SWi is connected to an analog input voltage Vin; SW1 is a reset switch connected between the input terminal and the output terminal of an inverter INV. The operation is as follows:

1. During the autozero mode: SWr and SW1 are on, and SWi is off. The reference voltage Vref appears on the left side of a storage capacitor C, and a voltage $V_{TH}$ appears on the right-hand side of the capacitor as well as the input and output of the inverter, where $V_{TH}$ is the threshold voltage of the transfer characteristic of the inverter when the output voltage Vout is equal to the input voltage Vin as depicted by FIG. 1(b). This point lies in high-gain region of the inverter where the transfer characteristic is very steep. The voltage across the capacitor is equal to $Vref - V_{TH}$.

2. During the compare mode: SWi and SW1 are off, and SWr is on as shown in FIG. 2. The left-hand side of C is connected to an input voltage Vi. Since the voltage across a capacitor cannot change instantaneously, the voltage on the right-hand side of the capacitor becomes $(Vi - Vref) + V_{TH}$. Due to the amplification of the inverter A, the output voltage Vo of the inverter becomes $V_{TH} - A(Vi - Vref)$. Thus Vi is compared with Vref and only the difference is amplified. Any fluctuation in $V_{TH}$ does not affect the amplification, and this double sampling correction technique is known as the "autozero" type.

Although the autozero type comparators for a parallel or "flash" ADC have the advantage of high-speed parallel operation, there are several drawbacks:

1. Since a large number of comparators are used for a high bit number ADC, the power dissipation and the chip size are very large.

2. Because of the large number of comparators, the loading of the input analog signal Vi is very heavy. The loading is a dynamic one in that the buffer for Vi experiences large loading variations during the switching transients which can cause serious Vi corruption.

Due to the foregoing drawbacks, it is more practical to use the sub-ranging (2-step) ADC. In the sub-ranging ADC, the input analog signal Vi is first converted into a digital signal with a coarse resolution during the first step, and then converted with a fine resolution in the second step. In so doing, each step need only to resolve one half of the number of total bits.

The basic principle of a sub-ranging N-bit ADC is shown in FIG. 3. After the more significant N/2 bits are converted in the first step by comparing with $2^{N/2}$ reference voltages, another set of $2^{N/2}$ reference voltages with a narrower voltage range of fine resolution centered around an analog voltage corresponding to the MSB in the first step are derived from a Reference Matrix. The result of the second step yields the less significant bit digital signals.

To perform the second step for fine resolution, the analog input signal Vi must be sampled and held (S/H), because the analog input signal must wait until the reference voltages have been derived from the Reference Matrix after the first coarse conversion step. The S/H circuit therefore plays an important role in a two-step sub-ranging ADC.

In a CMOS "autozero-type inverter" comparator for a sub-ranging ADC, the S/H function is commonly accomplished with a circuit as shown in FIGS. 4(a) and (b), which is similar to FIG. 1(a) and also possesses the autozeo function. However, it should be noted that the input voltage Vi and the reference voltage Vref are now reversed during the autozero mode. The analog input voltage Vi appears at the left-hand side of the capacitor C, and the inverter threshold voltage $V_{TH}$ appears on the right-hand side of the capacitor. After the completion of the autozero operation, all the switches are off, and the capacitor can hold the potential difference $Vi - V_{TH}$ for the S/H function until the compare mode. During the compare mode, SWi is off, SWr is on and SW1 is off as shown in FIG. 4(b). During the compare mode for the more significant bits, Vref is a fixed reference voltage. During the compare mode for the less significant bits, Vref is derived from the digital signal of the more significant bits in the first step. Thus, this comparator can achieve the autozero function for both the first coarse conversion step for the more significant bits and the second fine conmversion step for the less significant bits. At the same time, this comparator performs the S/H function necessary for the subranging ADC.

For a sub-ranging ADC, this autozero technique is satisfactory when the operation has reached a steady-state. However, during dynamic operation, the Vi induces a spurious current CdVi/dt to flow through the capacitor C and the reset switch SW1 as shown in FIG. 5. Due to the ohmic resistance $R_{sw1}$ of the reset switch, which is closed in the autozero mode, an offset voltage $V = R_{sw1} CdVi/dt$ appears across SW1. This offset voltage adversely affects the accuracy of the autozero function of the inverter. The inaccuracy depends on the values of C and $R_{sw1}$. At high input frequency of Vi, this RC time constant further limits the bandwidth of the ADC.

SUMMARY

An object of this invention is to provide an accurate autozero circuit for a high speed analog-to-digital converter. Another object of this invention is to provide an accurate autozero circuit for an ADC which is not affected by the ohmic resistance of the switches used in the autozero circuit. Still another object of this invention is to provide an autozero circuit for an ADC, which has a wide bandwidth. A further object of this invention is to provide an accurate autozero circuit which also provides sample-and-hold function for a sub-ranging ADC.

These objects are achieved in this invention by splitting the holding capacitor into two sections and connecting a "current canceler" between the two sections.

During the autozero mode, The spurious current induced by Vi flows only through the current canceler but not through the second section. Thus, no spurious current flows through the reset switch between the input and the output of the inverter to produce any offset voltage and to limit the bandwidth of the ADC. This current canceler provides a low impedance path for the spurious current induced by the input voltage.

BRIEF DESCRIPTION OF THE DRAWINGS

FIG. 1(a) shows the basic prior-art autozero circuit for an ADC during the autozero mode. FIG. 1(b) shows the threshold voltage used in the inverter in the autozero circuit.

FIG. 2 shows the conditions of the switches in the autozero circuit during the compare mode of the ADC.

FIG. 3 shows the block diagram of a sub-ranging ADC.

DETAILED DESCRIPTION OF THE PREFERRED EMBODIMENT

Figure 4A:
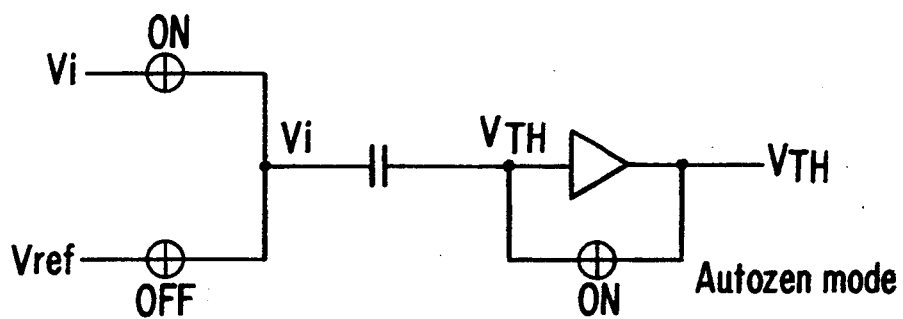
FIG. 4(a) shows the switch conditions of the autozero comparator with sample-and-hold function for a sub-ranging ADC during the autozero mode.
Figure 4B:
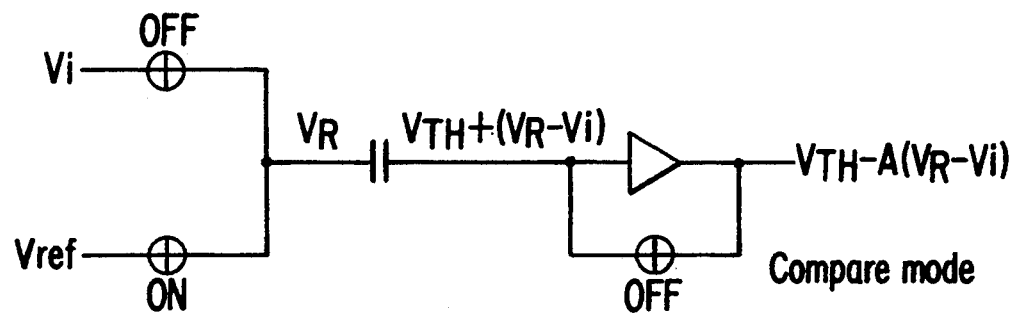
FIG. 4(b) shows the switch conditions during the compare mode.
Figure 5:
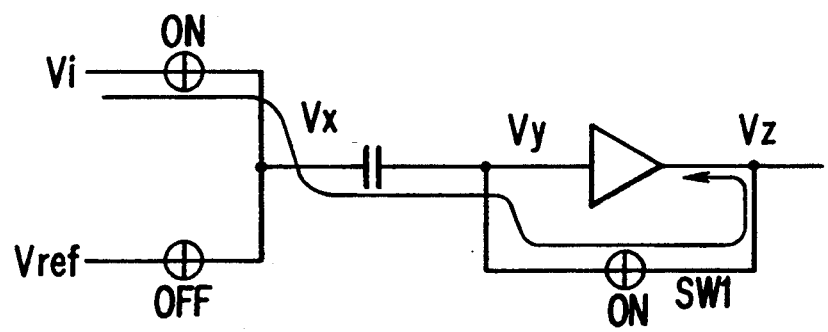
FIG. 5 shows the spurious current path of the current induced by the input voltage Vi to the autozero comparator.
Figure 6:
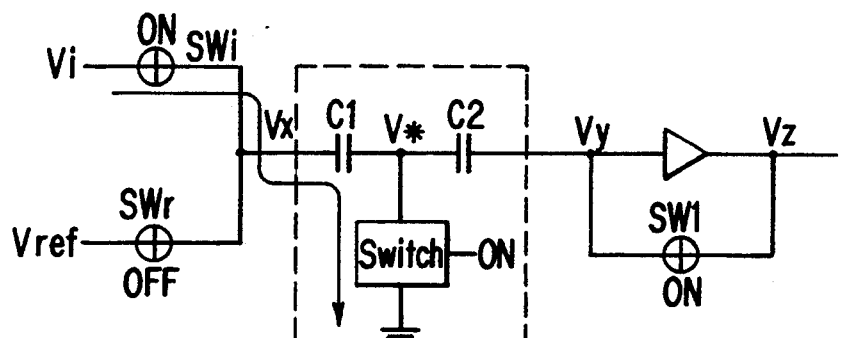
FIG. 6 shows the basic circuit for using a current canceler to cancel the spurious current induced by the input analog voltage according to this invention.

FIG. 6 shows the basic scheme of this invention. A sampling switch SWi is connected to an analog input signal Vi and another sampling switch SWr is connected to a reference voltage Vref. The output side of these sampling switches are connected together to sample Vi during the autozero mode and to sample Vref during the campare mode.

The common connection of these two switches is sampled with a voltage Vx and connected to a T-network. The T-network has two capacitors C1 and C2 connected in series to the input of an inverter INV with a voltage Vy. The joint between the two capacitors is shunted to ground through a control switch SW2, and has a voltage V*.

The inverter is short-circuited between the input Vy and the output Vz through the reset switch SW1 during the autozero mode. There is no connection between Vy and Vz during the compare mode.

The T-network constitutes a current canceler. During the autozero mode, the spurious current induced by Vi flows through SW2 and is bypassed by the current canceler. There is no current flowing through C2 and SW1.

Figure 7A:
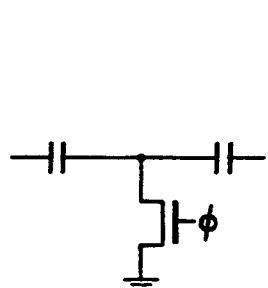
FIGS. 7(a)-(c) shows the different circuits for the current canceler.
Figure 7B:
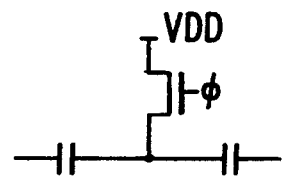
Figure 7C:
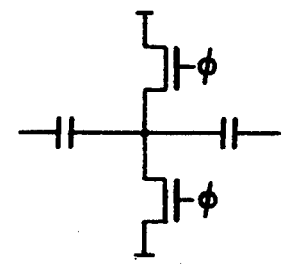

The current canceler can be constructed with MOS transistors (MOSFET) as shown in FIGS. 7(a), (b), and (c). In FIG. 7(a), an MOSFET M1 is connected between V*, and ground as the shunt branch of the T-network. In FIG. 7(b), an MOSFET M2 is connected between V*, and the positive supply $V_{DD}$ as the shunt branch of the T-network. In FIG. 7(c), two complementary MOSFETs Mp and Mn are connected respectively to $V_{DD}$ and ground to serve as the shunt branch of the T-network. All three circuits provide low impedance path to ground at point V*.

Figure 8A:
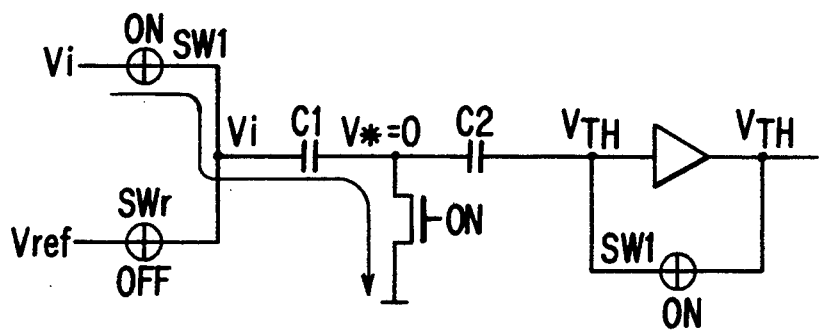
FIG. 8(a) shows the operation of the current canceler during the autozero mode.
Figure 8B:
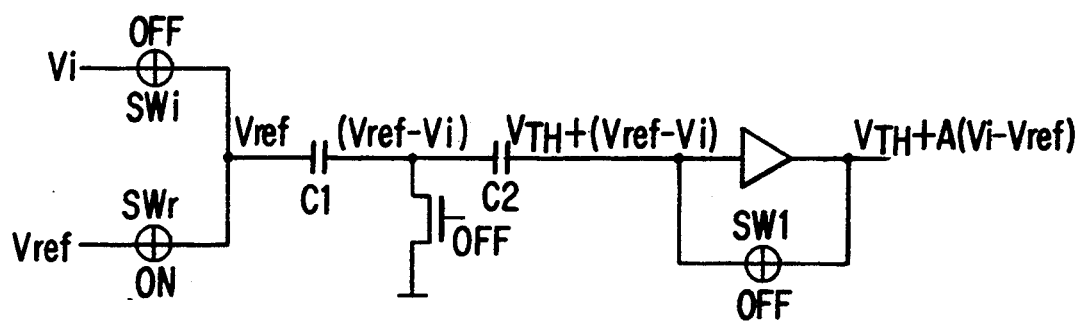
FIG. 8(b) shows the operation of the current canceler during the compare mode.

During the autozero mode of the ADC, the operation is shown in FIG. 8(a). SWi is on, SWr is off, SW1 is on and SW2 is on. The left-hand electrode of C1 is impressed with a voltage Vi. The right-hand electrode of C1 is at a potential V*, which is approximately equal to zero. Any spurious current induced by Vi flows from V* to ground through SW2, and no longer flows toward C2 to the right-hand side of V*. Thus, SW2 serves as a spurious current canceler. The right-hand electrode of C2 is then held at the threshold voltage of the inverter INV without any sprious disturbance.

During the compare mode, SWi is off, SWr is on, SW1 is off and SW2 is off. Then, Vref is sampled and appears at the left-hand electrode of C1. Vref subtracts Vi, to which C1 has been charged during the autozero mode, and causes a voltage Vref−Vi to appear at the floating point between C1 and C2. This difference voltage is added to $V_{TH}$, to which C2 has been charged during the autozero mode, and causes a voltage $V_{TH}$+(Vref−Vi) to appear at the input to the inverter INV. The output of INV then has an amplified signal A(Vi−Vref) superimposed over the original threshold voltage $V_{TH}$. In this manner, the comparator function is accomplished.

While the foregoing description is devoted to an ADC, the canceler is applicable to all MOSFET circuits where autozero technique is used.

What is claimed is;

1. An autozero-type comparator for an analog-to-digital converter (ADC) having an autozero mode of operation and a compare mode of operation, comprising:

an inverter having an input terminal and an output terminal;

a reset switch connected between said input terminal and said output terminal of said inverter;

a first sampling switch with input terminal connected to an analog signal and an output terminal;

a second sampling switch with input terminal connected to a reference voltage and an output terminal;

joint means for connecting said output terminals of said first sampling switch said second sampling switch;

a T-network having two capacitors connected in series between said joint means and said input terminal of said inverter, and a shunting switch connected between the common joint between between said capacitors and an ac ground;

during said autozero mode, said first sampling switch being on, said second sampling switch being off, said reset switch being on, and said shunting switch being on, so that a spurious current induced by said analog signal can be canceled;

during said compare mode, said first sampling switch being off, said second sampling switch being on, said reset switch being off, and said shunting switch being off so that a voltage difference between said analog signal and said reference voltage can be compared and amplified at said output terminal of said inverter.

2. An autozero-type comparator as described in claim 1, wherein said ADC is a sub-ranging type.

3. An autozero-type comparator as described in claim 2, wherein said comparator serves as a sample-and-hold circuit, in which the differential voltage between the input analog voltage and the reference voltage is held in said two capacitors in said T-network.

4. An autozero-type comparator as described in claim 1, wherein said shunting switch is an MOS transistor.

5. An autozero-type comparator as described in claim 1, wherein said ac ground connected to said shunting switch is the ground terminal of the supply voltage for said inverter.

6. An autozero type comparator as described in claim 1, wherein said ac ground connected to said shunting switch is the positive power supply for said inverter.

7. An autozero-type comparator as described in claim 1, wherein said shunting switch is a pair of complementary MOS transistors, connected respectively to the positive supply and the negative power supply of said inverter as said ac ground.

8. An autozero-type comparator as described in claim 1, wherein said ADC is a sub-ranging type with a coarse analog-to-digital conversion for the more significant bits of total digital signals and a fine analog-to-digital conversion for the less significant bits of said total digital signals.

9. An autozero-type comparator as described in claim 8, wherein said comparator performs a sample-and-hold function.

10. An autozero-type comparator as described in claim 9, wherein said hold function is implemented by turning off all said switches.

* * * * *